United States Patent [19]

Buchanan

[11] 3,898,477

[45] Aug. 5, 1975

[54] SELF RATIOING INPUT BUFFER CIRCUIT

[75] Inventor: John K. Buchanan, Tempe, Ariz.

[73] Assignee: Motorola, Inc., Chicago, Ill.

[22] Filed: June 3, 1974

[21] Appl. No.: 475,376

[52] U.S. Cl. ................ 307/205; 307/214; 307/304; 307/DIG. 1

[51] Int. Cl.$^2$ H03K 19/08; H03K 19/40; H03K 3/353

[58] Field of Search ........... 307/205, 214, 215, 218, 307/270, 304, DIG. 1

[56] References Cited

UNITED STATES PATENTS

| | | | |
|---|---|---|---|
| 3,478,229 | 11/1969 | Avery | 307/205 X |
| 3,479,523 | 11/1969 | Pleshko | 307/205 |
| 3,564,299 | 2/1971 | Varadi et al. | 307/205 X |
| 3,708,689 | 1/1973 | Lattin | 307/205 |

*Primary Examiner*—Michael J. Lynch
*Assistant Examiner*—L. N. Anagnos
*Attorney, Agent, or Firm*—Vincent J. Rauner; Charles R. Hoffman

[57] ABSTRACT

An MOS inverter which may be used as an input buffer on an integrated circuit chip includes a first load MOSFET having its gate and drain coupled to a supply conductor and a second MOSFET load device coupled between the supply conductor and the output terminal of the input buffer. The gate of the second MOSFET load device is connected to the output of a MOSFET bias circuit coupled between the voltage supply conductor and the ground conductor. The bias circuitry establishes a bias potential such that the inverter ratio of the input buffer varies as a function of MOSFET processing parameters by reducing the inverter ratio at low MOSFET threshold voltages and increasing the inverter ratio at high MOSFET threshold voltages, thereby improving the noise immunity and speed of the circuit.

7 Claims, 2 Drawing Figures

SELF RATIOING INPUT BUFFER CIRCUIT

BACKGROUND OF THE INVENTION

MOSFET LSI circuits (metal oxide semiconductor field effect transistor large scale integrated circuits) have established a position in the electronics industry as a means of achieving high circuit functional densities at relatively low costs for many applications. It is frequently necessary to interface such MOSFET LSI circuits with bipolar logic circuits from conventional logic circuit families, such as TTL, because of the relatively high "drive" capability of bipolar circuits compared to MOSFET circuits. However, due to the different characteristics of bipolar circuits and MOSFET circuits, and due to the wide variety of MOSFET processing techniques which have arisen during the evolution of the MOS processing art, a wide variety of interface circuits or input buffer circuits have been designed and utilized in products which have been marketed. However, none of the input buffer circuits have been satisfactory for a wide range of applications. Particularly with the advent of low threshold N-channel MOSFET processing techniques, the problem of designing an input buffer which provides adequate on-chip driving capability to MOS circuits on the chips over the range of threshold voltages and temperatures which may be expected has been acute. The difficulty arises because of the fact that the available bipolar drive signals have a logic swing ranging between approximately 0.4 volts to 2.4 volts and for worst case operating conditions, a range of 0.8 volts to 2.0 volts must be specified to provide and optimally marketable device. But the input levels are incompatible with normal N-channel low threshold voltage MOS processing over the range from 0°C to 100°C because the MOS threshold voltage $V_{to}$ may range from 0.25 volts at 100°C to 1.15 volts at 0°C. Clearly, the difficulty of designing an input buffer circuit with good noise immunity and adequate speed to be interfaced with such an input signal is difficult. Further aspects of the problem are explained in U.S. Pat. No. 3,676,700 by the same inventor and also U.S. Pat. No. 3,708,689 by William W. Lattin. However, for the circuits described in these patents and in other known input buffers or input inverters, the main problem encountered in designing them is the range of threshold voltage of the MOS process as a function of material parameters and also of specified temperature operating ranges. For a low $V_{to}$ and high temperature, the input or switch MOSFET is overdriven by the 0.8 volt input level, since the threshold voltage is only 0.25 volts. As a result, a low "inverter ratio" is required, since a low resistance load device is required to pull the output voltage to a satisfactory high "1" output level (the inverter ratio is the ratio of the width to length ratio of the switch device to the width to length ratio of the load device). However, a low inverter ratio is unsatisfactory for the case in which the temperature is low and the MOS threshold voltage $V_{to}$ is high, because then the 2.0 volt input level corresponding to a logical 1 input state does not provide sufficient drive to the inverter switch device to achieve a satisfactory low "0" level on the chip.

SUMMARY OF THE INVENTION

It is an object of this invention to provide an improved input buffer circuit.

It is another object of this invention to provide an improved MOSFET input buffer for integrated circuits.

It is another object of this invention to provide an improved MOSFET input buffer for integrated circuits wherein the inverter ratio varies as a function of manufacturing process parameters.

Briefly described, the invention is a self-ratioing load element or an inverter or logic gate. The self-ratioing feature varies the impedance ratio of the inverter or logic gate as a function of processing parameters of the semiconductor on which the device is fabricated. The inverter ratio tracks with processing parameters in such a way as to improve worst case design of the device.

DESCRIPTION OF THE INVENTION

Figure 1:
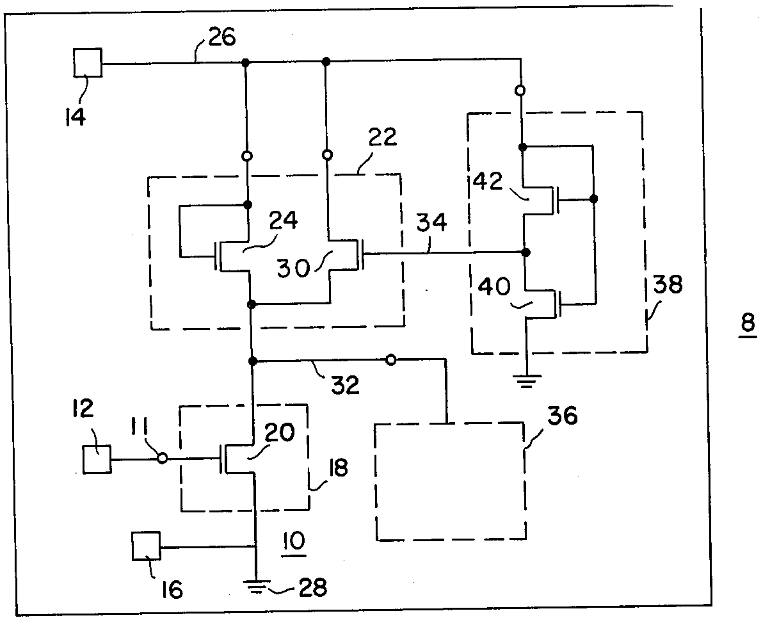
FIG. 1 is a drawing which schematically depicts an integrated circuit chip and an input buffer circuitry thereon.

FIG. 1 depicts an integrated circuit chip 8 including thereon input buffer circuit 10 having its input 11 connected to input bonding pad 12 and its output 32 connected to MOS circuitry 36. Input buffer 10 includes a logic circuit element 18, which may be combinational logic including a plurality of MOSFETs, in which case input buffer 10 is a combinational logic gate, or may include a single input device 20, in which case input buffer 10 is an inverter. MOSFET 20 has its source connected to ground conductor 28, which is coupled to bonding pad 16, and its drain connected to output conductor 32. MOSFET 24 has its source connected to the drain of MOSFET 20 and to output conductor 32, and its gate and drain connected to voltage supply conductor 26, which is connected to bonding pad 14. MOSFET 30 has its drain connected to voltage supply conductor 26 and its source connected to output conductor 32. MOSFETs 24 and 30 comprise effectively a composite load device for input buffer 10, said load device being generally designated by reference numeral 22. The gate of MOSFET 30 is connected to output conductor 34 of bias circuit 38. Bias circuit 38 includes, in one embodiment, MOSFETs 42 and 40 coupled in series between supply voltage conductor 26 and ground conductor 28, both MOSFETs having their gates connected to conductor 26 and the junction there between connected to output conductor 34.

The following table gives nominal values for the width and length in mils of the MOSFETs in the schematic of FIG. 1.

| MOSFET | CHANNEL WIDTH (MILS) | CHANNEL LENGTH (MILS) |
|---|---|---|
| 20 | 3.5 | 0.25 |
| 24 | 1.4 | 0.35 |
| 30 | 0.4 | 0.35 |
| 40 | 0.3 | 3.0 |
| 42 | 0.4 | 0.3 |

For an N-channel manufacturing process having a nominal MOS threshold voltage $V_{to}$ ranging from 0.4 volts to 1.0 volts at room temperature, the input buffer circuit of FIG. 1 operates well with a 5 volt power supply for a particular process. This is true even though the range of $V_{to}$ varies from 0.25 volts to 0.84 volts at 100°C and from 0.55 volts to 1.15 volts at 0°C. The input buffer of FIG. 1 is capable of accepting a TTL input logic signal with a worst case 0 level of 0.8 volts and a worst case 1 level of 2.0 volts. The capability of accepting these logic levels provides a substantial advantage in practical system designs over the normal worst case TTL levels of 0.4 volts for a logical 0 and 2.4 volts for a logical 1.

For known MOSFET inverters and input buffers, the range of threshold voltages stated above is incompatible with the former worst case input logic levels. The present invention is directed to solving the circuit design problems previously encountered by providing circuitry which modifies the inverter ratio as a function of temperature and $V_{to}$.

According to the invention, the inverter ratio (width to length ratio of the switching MOSFET divided by width to length ratio of the load MOSFET) changes as a function of the input voltage and $V_{to}$ (and possibly also with temperature) by provision of an additional load device 30 in parallel with the usual inverter load device 24. Additional MOSFET load 30 has its gate connected to a biasing circuit, and to the source of a MOSFET 42 thereof which has its gate connected to its drain. For the values listed in the above table, MOSFET 40 acts as a bleeder device and the bias voltage on conductor 34 is approximately 1 threshold voltage drop below the voltage on conductor 26, commonly designated VDD. Therefore, if output 32 of input buffer 10 is more positive than two threshold drops below VDD, MOSFET 30 will be off and does not contribute to the conduction provided by composite load device 22. Clearly, the voltage at which MOSFET 30 begins to conduct is a function of $V_{to}$ of the integrated circuit chip 8.

However, when the output voltage of inverter 10 is less in magnitude than $V_{DD} - 2\ V_{TH}$ ($V_{TH} = V_{to} + V$ Body Effect) the current through composite load device 22 is determined by both MOSFETs 24 and 30, and the effective inverter ratio is therefore varied as a function of $V_{to}$. The point at which MOSFET 30 begins to contribute to the composite load current can be controlled by biasing circuit 30, by, for example, connecting the gate of MOSFET 42 to a separate control terminal or by connecting the gate of MOSFET 40 to a separate control terminal.

A plurality of parallel load devices additionally could be provided, each biased to switch into conduction at a different value input voltage, thereby providing a particular functional relationship between the inverter ratio and the input voltage tracking as a function of $V_{to}$.

The advantage according to the invention is that it allows design of a MOSFET inverter circuit or buffer circuit that provides much greater noise immunity for a given fixed load device load MOSFET 24 (which is designed to provide a certain charging rate to capacitance associated with output node 32) that known MOSFET inverter techniques. This is because, for high threshold voltages, a sum of the threshold voltage $V_{to}$ drops from MOSFET 42 and MOSFET 30 to output node 32 prevents MOSFET 30 from switching into conduction until the output voltage is nearly at a 0 level because MOSFET 30 is only slightly overdriven due to the large value of $V_{to}$. Therefore, MOSFET 30 contributes very little to the composite load impedance of load device 22. The inverter ratio is therefore dependent on the ratio of the width to length ratios of MOSFETs 20 and 24. However, for a low threshold voltages $V_{to}$, MOSFET 30 is switched into conduction in parralel with MOSFET 24 when the output voltage is lower than $VDD-2V_{th}$, which may be only about 0.8 volts below VDD. Thereafter, the effective composite inverter ratio is decreased, and the composite load resistance is increased so that an acceptably high 1 logic level exists for the low threshold case when the input signal is at 0.8 volts.

Figure 2:
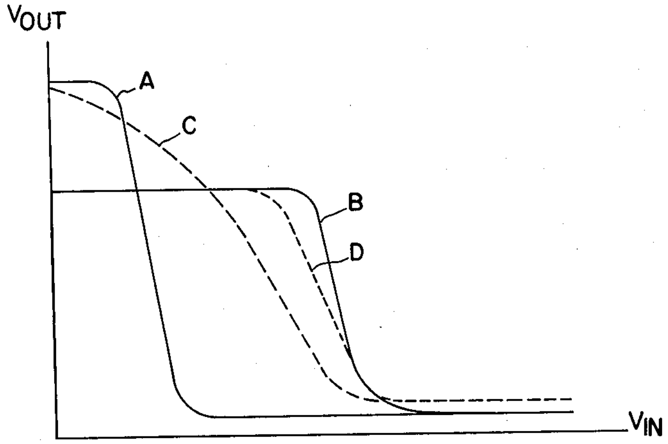
FIG. 2 is a transfer characteristic of the input buffer circuit of FIG. 1, which is useful in describing the operation of the invention.

The composite transfer characteristics shown on FIG. 2 may be helpful in describing the operation of the input buffer of FIG. 1. The segment of the transfer curve labeled A represents the transfer curve of an inverter consisting of MOSFETs 20 and 24 for the worst case low value of $V_{to}$. The segment of the transfer curve labeled B represents the transfer characteristic for the same inverter (consisting of MOSFETs 20 and 24) for the worst case high value of $V_{to}$. Curve C of FIG. 2 represents the transfer characteristic of the inverter as shown in FIG. 1 including MOSFET 30 and bias circuit 38 for the worst case low threshold voltage. It is seen that the effect is to shift the transfer characteristic C to the right with respect to curve A, thereby increasing the noise immunity for an input logical 0 level. Of course, for the higher threshold case, the composite curve, represented by D, is shifted further to the right, further increasing the noise immunity for the case of a logical input 0 level.

In summary, it is seen that the invention provides an inverter or input buffer circuit in which the inverter ratio varies as a function of the MOS threshold voltage $V_{to}$, and provides a low inverter ratio at low MOS threshold voltages and a high inverter ratio at high MOS threshold voltages, thereby providing improved noise immunity for a given width to length ratio of MOSFET 24. Clearly, the approach to designing an input buffer according to the teaching of the invention is to select the inverter ratio which, for the 2.0 volt input level, provides a satisfactory low output 0 level. Then, a sufficiently low amount of resistance (MOSFET 30) is switched into conduction in parallel with the original load MOSFET 24 to provide an acceptably high 1 level at node 32 for the case when the input level is at 0.8 volts.

While the invention has been described with reference to a particular embodiment thereof, those skilled in the art will recognize that variations in form and in placement of parts may be made within the scope of the invention.

What is claimed is:

1. A semiconductor circuit including an output, first and second voltage conductors, a load circuit and a switching circuit coupled in series between said first and second voltage conductors comprising:

logic switching means in said switching circuit coupled between said second voltage conductor and said output;

first load means in said load circuit coupled between said first voltage conductor and said output; and second load means coupled between said first voltage conductor and said output for controlling the ratio of the effective channel width-to-length ratio of said switching circuit of said circuit to the effective channel width-to-length ratio of said load circuit as a function of semiconductor processing parameters of said circuit.

2. The semiconductor circuit as recited in claim 1 further including transistor bias circuit means coupled between said first and second voltage conductors for establishing a threshold voltage level at which said second load means begins current conduction as a function of a semiconductor processing parameter of said semiconductor circuit coupled to a control element of said second load means.

3. The semiconductor circuit as recited in claim 2 wherein said first load means and said second load means each comprises a MOSFET, and said logic switching means includes a switching MOSFET coupled between the source of said first load MOSFET and said voltage conductor means.

4. The semiconductor circuit as recited in claim 3 wherein said first load MOSFET has its gate and drain coupled to said voltage conductor means.

5. The semiconductor circuit as recited in claim 4 wherein said bias circuit means includes first and second MOSFETs coupled in series between said first and second voltage conductor, the gate of said second MOSFET being connected to said first voltage conductor.

6. The semiconductor circuit as recited in claim 5 wherein the gate of said first MOSFET is coupled to said first voltage conductor.

7. An input buffer of the inverter type on a MOSFET integrated circuit chip connected between first and second voltage conductors and having an input terminal coupled to an input bonding pad and an output terminal coupled to other MOS circuitry on said integrated circuit chip and means for adjusting the inverter ratio of said input buffer as a function of the MOS threshold voltage comprising:

a first MOSFET coupled between said second voltage conductor and said output terminal of said input buffer and having its gate coupled to said input bonding pad;

a second MOSFET coupled between said first voltage conductor and said output terminal having its gate connected to its drain;

a third MOSFET coupled between said first voltage conductor and said output terminal;

a MOSFET bias circuit having an output terminal coupled to control said third MOSFET and coupled between said first and second voltage conductors for establishing a bias voltage for controlling the characteristic inverter ratio of said input buffer.

* * * * *